(12) United States Patent
Mattes et al.

(10) Patent No.: US 7,256,602 B2
(45) Date of Patent: Aug. 14, 2007

(54) ELECTRICAL CIRCUIT AND METHOD FOR TESTING INTEGRATED CIRCUITS

(75) Inventors: Heinz Mattes, Munich (DE); Sebastian Sattler, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/937,116

(22) Filed: Sep. 9, 2004

(65) Prior Publication Data
US 2005/0231228 A1 Oct. 20, 2005

(30) Foreign Application Priority Data
Sep. 9, 2003 (DE) ............................... 103 41 836

(51) Int. Cl.
*G01R 31/26* (2006.01)
(52) U.S. Cl. ...................................... 324/765; 324/754
(58) Field of Classification Search ...................... None
See application file for complete search history.

(56) References Cited

U.S. PATENT DOCUMENTS

| 4,544,981 A | 10/1985 | Hakoopian |
| 4,999,630 A * | 3/1991 | Masson ....................... 341/120 |
| 5,051,689 A * | 9/1991 | Hiwada et al. ............. 324/754 |
| 6,703,952 B2 * | 3/2004 | Giddens et al. ............. 341/120 |
| 6,885,324 B1 * | 4/2005 | Quinlan ...................... 341/120 |
| 6,903,565 B2 * | 6/2005 | Hartmann ................... 324/765 |
| 2002/0107654 A1 | 8/2002 | Mori et al. |
| 2005/0154945 A1* | 7/2005 | Haag et al. ................. 714/724 |

FOREIGN PATENT DOCUMENTS

JP 11295394 10/1999

OTHER PUBLICATIONS

Fairchild Semiconductor Corporation, "LM2902, LM324/LM324A, LM224/LM224A Quad Operational Amplifier," pp. 1-12 (2002). <www.fairchildsemi.com>.

* cited by examiner

*Primary Examiner*—Paresh Patel
(74) *Attorney, Agent, or Firm*—Dicke, Billig, Czaja, PLLC

(57) ABSTRACT

An electrical circuit including a test circuit and a method of testing electrical circuits is disclosed. In one embodiment, the circuit includes a electrical short-circuit protective circuit according to the invention for protecting an input contact against short-circuit having an input which is intended for connection to a signal generator, and an output which is intended for connection to a input contact. The input contact can be decoupled from the region lying upstream of the input of the electrical short-circuit protective circuit by the electrical short-circuit protective circuit.

15 Claims, 5 Drawing Sheets

ELECTRICAL CIRCUIT AND METHOD FOR TESTING INTEGRATED CIRCUITS

CROSS-REFERENCE TO RELATED APPLICATIONS

This Utility Patent Application claims priority to German Patent Application No. DE 103 41 836.9, filed on Sep. 9, 2003, which is incorporated herein by reference.

FIELD OF THE INVENTION

The invention relates to an electrical circuit and to a method for testing of electrical circuits, in particular, integrated circuits.

BACKGROUND

The production testing of integrated circuits constitutes a significant cost factor when manufacturing such integrated circuits. In order to optimize the costs that are incurred when production testing integrated circuits, attempts are frequently made to utilize the available test systems in the best possible way. If the test algorithm with which the integrated circuits are tested is optimized for a minimum testing time, all the possibilities for reducing costs are already exhausted with this approach.

Another approach for testing integrated circuits is to test a plurality of integrated circuits simultaneously on a single tester. For this it is necessary for the testers used to be correspondingly equipped, in particular for the load board to be adapted to hold a plurality of integrated circuits. A load board is understood here to be a base which is used in such a test and which is capable of holding one or more integrated circuits to be tested.

When such parallel testing of integrated circuits is carried out there is frequently the problem that owing to a single faulty integrated circuit all the integrated circuits of the respective parallel test run are classified as faulty and therefore eliminated. As a result, the yield is reduced and the unit costs for the faultfree integrated circuits are increased.

SUMMARY

The present invention provides an electrical circuit including a test circuit and a method of testing electrical circuits. In one embodiment, the circuit includes a electrical short-circuit protective circuit according to the invention for protecting an input contact against short-circuit having an input which is intended for connection to a signal generator, and an output which is intended for connection to a input contact. The input contact can be decoupled from the region lying upstream of the input of the electrical short-circuit protective circuit by the electrical short-circuit protective circuit.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
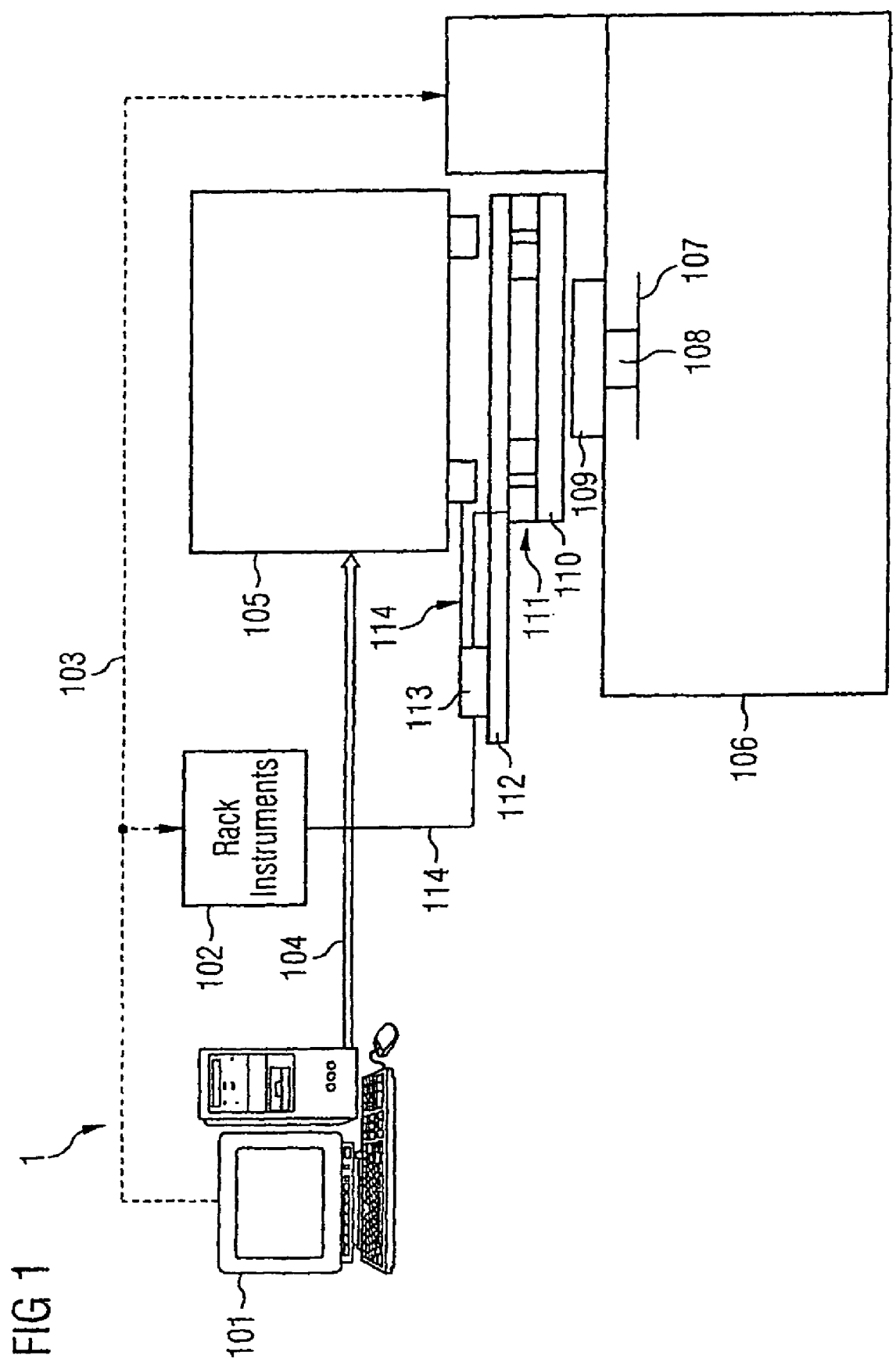
FIG. 1 illustrates a schematic illustration of a tester setup.

FIG. 1 illustrates a schematic illustration of one embodiment of a tester setup 1.

The tester setup 1 comprises a control computer system 101 which is connected via a network line 103 to the signal generators and measuring instruments 102, referred to in FIG. 1 as "rack instruments", and to a measuring table 106 as well as to a tester 105 via a control line 104. On the measuring table 106 there is a support surface 107, which is often also referred to as a chuck. Semiconductor wafers (not shown in FIG. 1) with integrated circuits that are to be tested or integrated circuits that have already been separated lie on this support surface 107. Contact is made with the wafers or circuits by a base for housed components or by a needle card 108 and the wafers or circuits are connected to a switching matrix 113 via a first intermediate level 109, via a second intermediate level 110, via a third intermediate level 111 and via a fourth intermediate level 112 and via measurement data lines 114. A load board, which is provided for holding one or more integrated circuits, is not illustrated in FIG. 1. In one embodiment, measuring table 106 includes a Prober TSK UF200.

The switching matrix 113 is connected to the tester 105 and to the measuring instruments 102 by means of measurement data lines 114. The switching matrix 113 is embodied here in such a way that it can conduct the signals of the measuring instruments 102 and the input data of the tester 105 via the intermediate levels 109-112 to specific connecting contacts of the needle card 108 or to specific connecting contacts of the load board (not shown in FIG. 1). The connecting lines of the load board with the tester 105 are also referred to as "tester channels".

The tester 105 is a cost-effective tester which operates in a digital fashion and may be equipped with optional analog measuring equipment and analog generators. In one embodiment, tester 105 includes a Teradyne J750. The highly sensitive measuring instruments 102 which operate in a highly precise fashion are arranged here in a separate measuring instrument cabinet at a specific distance from the measuring table 106 and from the tester 105.

In one embodiment, the data lines between the measuring instruments 102 and the connecting contacts of the needle card 108 as well as of the load board have a length of up to 2 m. As a result of this long line route and the ohmic contact resistances of the junctions between the intermediate levels 109-112, voltage drops of the measuring signals generated by the measuring instruments 102 occur at the test contacts of the needle card 108 and of the load board.

Figure 2:
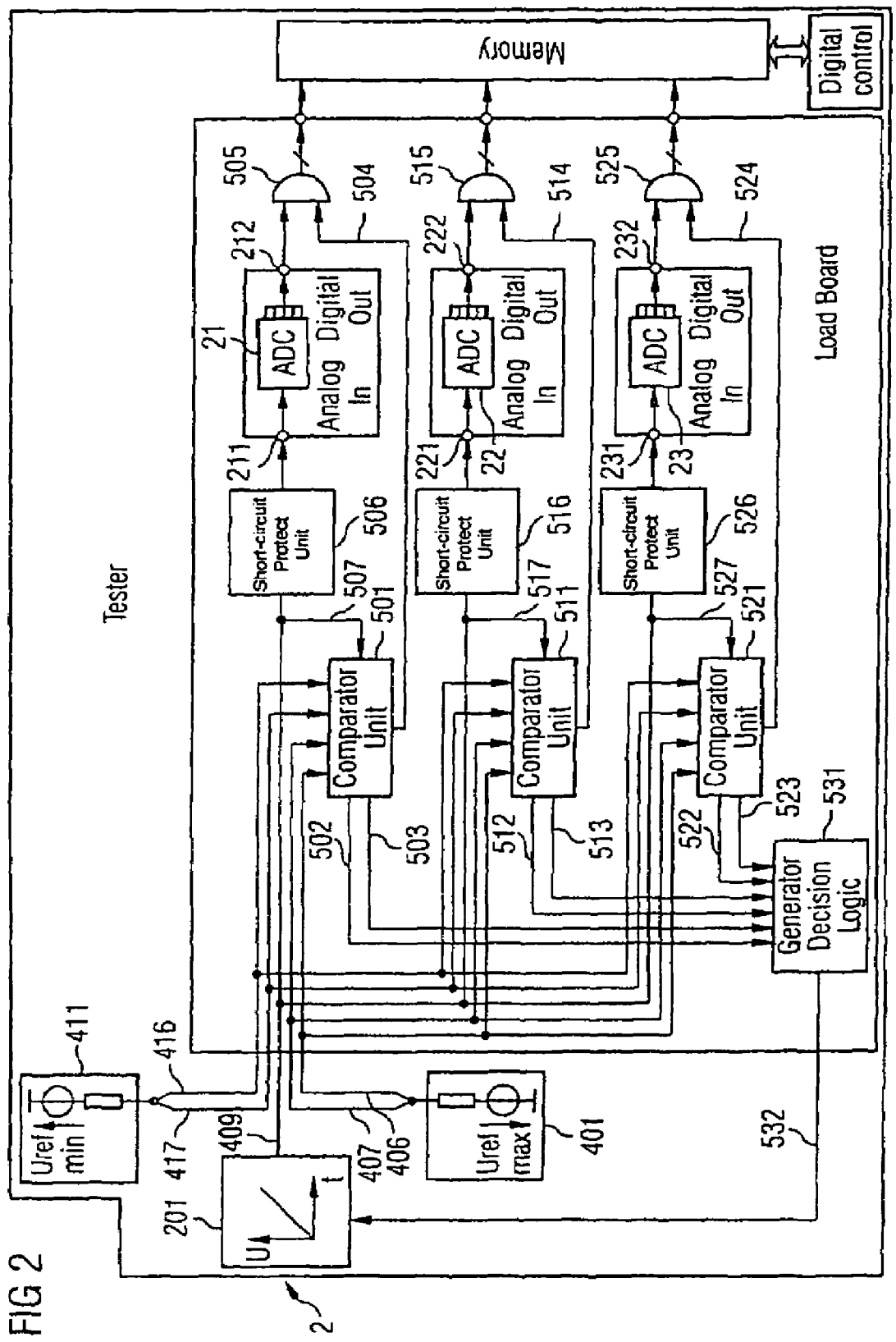
FIG. 2 illustrates a parallel test circuit diagram with three A/D converters and with three short-circuit protective circuits.

FIG. 2 illustrates a parallel test circuit diagram 2 with a first A/D converter 21, with a second A/D converter 22 and with a third A/D converter 23.

In the parallel test circuit diagram 2, a precision signal generator 201 is provided which is arranged at the measuring instruments 102 and is capable of generating an analog ramp voltage. This ramp voltage is applied via a test signal line 409 to a first input contact 211, to a second input contact 221 and to a third input contact 231. This ramp voltage which is applied to the input contacts 211, 221 and 231 is processed by the first A/D converter 21, by the second A/D converter 22 and by the third A/D converter 23. The digital output values which are respectively generated by the A/D converters 21-23 as a function of the analog ramp voltage are passed on by output contacts 212, 222 and 232 to a memory area (not designated in more detail in FIG. 2) of the tester 105. The input contacts 211, 221 and 231 as well as the output contacts 212, 222 and 232 are arranged on the load board. The measured output values are compared with the anticipated setpoint values by the tester 105 which subsequently outputs a pass signal or a fail signal which indicates whether or not the respective A/D converter 21-23 has passed the test.

The parallel test circuit diagram 2 makes available a minimum/maximum calibration of the test signals which are present at the input contacts 211, 221, 231. For this purpose, the parallel test circuit diagram 2 has a first reference signal generator 401 for generating a maximum reference voltage and a second reference signal generator 411 for generating a minimum reference voltage.

A first reference line 406 and a first calibration line 407 lead from the first reference signal generator 401 to the comparator units 501, 511 and 521, and a second reference line 416 and a second calibration line 417 lead from the second reference signal generator 411 to the comparator units 501, 511 and 521.

In order to be able to route the reference lines 406 and 416, the calibration lines 407 and 417 and the test signal line 409 respectively in parallel to the three input contacts 211, 221, 231 as well as to the comparator units 501, 511, 521, these lines are each branched on the load board.

The parallel test circuit diagram 2 can be implemented on currently available testers. To do this the load board, as shown in FIG. 2, simply has to be adapted to hold a plurality of A/D converters 21-23.

A first comparator unit 501 is arranged near to the first input contact 211. In each case a second comparator unit 511 and a third comparator unit 521 are located in the direct vicinity of the input contacts 221 and 231.

The comparator units 501, 511, 521 can be operated in a test mode in which it is possible to detect individually for each A/D converter 21-23 to be tested whether the value of the test signal is too high or too low, or whether the test signal exceeds or drops below a reference signal.

For this purpose, feedback lines 507, 517, 527 branch in each case from the test signal line 409 to the comparator units 501, 511, 521. In FIG. 2, these feedback lines 507, 517, 527 each branch off before the short-circuit protective circuits 506, 516, 526. Alternatively to this it is possible for these feedback lines 507, 517, 527 to each branch off after the short-circuit protective circuits 506, 516, 526 and just directly before the respective input contacts 211, 221, 231 and to be routed back to the comparator units 501, 511, 521.

If the test signal which is actually present at the input contact 211, 221, 231 exceeds the reference signal, present on the first reference line 406, of the first reference signal generator 401 or drops below the reference signal, present on the second reference line 416, of the second reference signal generator 411, the precision signal generator 201 can be switched off directly by the respective comparator unit 501, 511, 521. For this purpose, a decision logic unit 531 is provided which is connected to the precision signal generator 201 by means of a control signal line 531.

The short-circuit protective circuits 506, 516, 526 lie in the signal path and are used to decouple the inputs, that is to say the input contacts 211, 221, and 231, from one another, which can prevent the yield from being reduced. Without such short-circuit protective circuits 506, 516 and 526, an internal short-circuit of the supply circuit $V_{SS}$ or $V_{DD}$ at a single analog input contact 211, 221, 231 would lead to this short-circuit also being present at the other input contacts 211, 221, 231 of the remaining functionally capable A/D converters 21-23. In this case, the tester 105 would classify all the tested A/D converters 21-23 as faulty although in reality only one of the three A/D converters 21-23 is faulty. As a result of the provision of the short-circuit protective circuits 506, 516, 526 it is ensured that when there is an internal short-circuit at just one of the input contacts 211, 221 and 231 only the respective faulty A/D converter 21, 22, 23 is eliminated. The parallel test can be continued for the other fault-free A/D converters 21, 22, 23.

Checking signal lines 504, 514, 524 extend from the comparator units 501, 511, 521 to AND gates 505, 515, 525 which are respectively arranged at the output contacts 212, 222, 232. The inputs of the AND gates 505, 515, 525 are each formed by the checking signal lines 504, 514 and 524 and by the data lines which are joined to the output contacts 212, 222, 232.

The comparator units 501, 511 and 521 can each have a separate calibration unit (not illustrated individually in FIG. 2) which is provided with the calibration line 406 and with the reference line 407 for the maximum voltage level, with the calibration line 416 and with the reference line 417 for the minimum voltage level and with the test signal line 409 for the analog ramp signal.

Before the start of each test cycle, the comparator units 501, 511, 521 are calibrated in parallel. In this calibration mode, the output signals of the comparator units 501, 511, 521 are conducted together to the decision logic unit 531 which derives control signals for the precision signal generator 201 from these output signals. The derivation of these control signals is self-evident to a person skilled in the art from the information contained in this patent document and does not need to be explained in more detail here.

The A/D converters 21-23 are then tested in the test mode.

Owing to external faults or due to the influence of the different signal paths it is possible for the measuring process to start and end at slightly staggered times at the A/D converters 21-23. For this reason, the valid time window has to be communicated to the tester 105 or to the evaluation logic which is present at the tester 105. This is done by means of a checking signal which is generated by the comparator units 501, 511, 521 and is communicated to the AND gates 505, 515, 525 via the checking signal lines 504, 514, 524.

Figure 3:
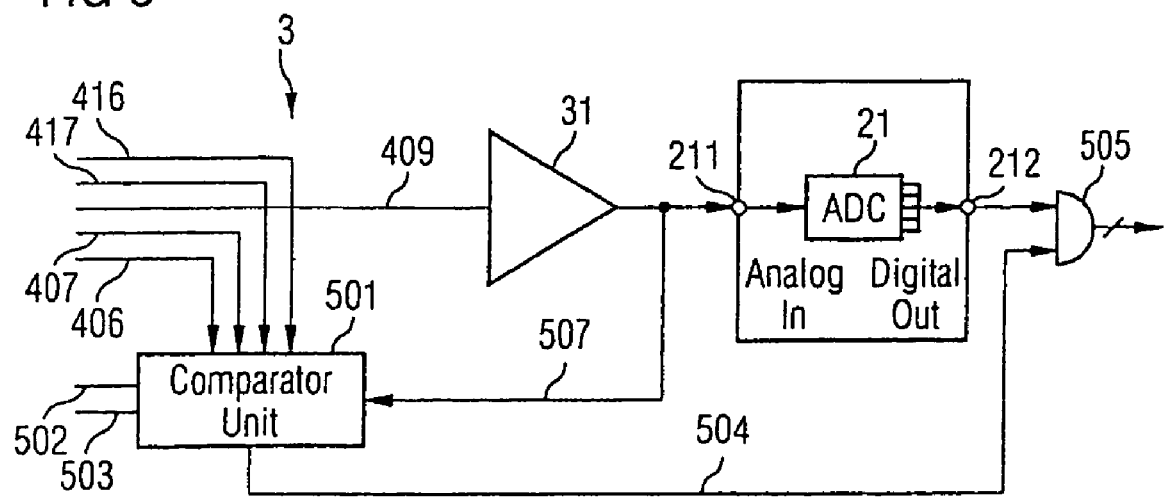
FIG. 3 illustrates a fourth short-circuit protective circuit according to an exemplary embodiment of the invention.

FIG. 3 illustrates a schematic illustration of a fourth short-circuit protective circuit 3 according to a first exemplary embodiment of the invention.

FIG. 3 illustrates in this context an enlarged detail from the parallel test circuit diagram 2 shown in FIG. 2 and comprises the first comparator unit 501, the second short-circuit protective circuit 516 which is embodied as an active first isolation amplifier 31, the first A/D converter 21 to be tested and the first AND gate 505.

If the first short-circuit protective circuit 506 is embodied as an active first isolation amplifier 31, no further measures need to be taken during the calibration and test mode. The short-circuit test can be carried out simultaneously for a plurality of A/D converters 21-23 which are connected in parallel.

However, in this embodiment of the invention stringent requirements are made of the frequency response and of the linearity of the active, first isolation amplifier 31, especially since the signal which is generated by the precision signal generator 201 has to be passed on by the first isolation amplifier 31 in an unfalsified form to the first input contact 211 which is assigned directly downstream. The first isolation amplifier 31 constitutes as it were an electrical decoupling means in which the feedback of the input signal which is present at the first input contact 211 is prevented from affecting the input contacts 221 and 231.

In contrast to the parallel test circuit diagram 2 in FIG. 2, the first feedback line 507 in FIG. 3 therefore does not branch off to the first comparator unit 501 until after the first isolation amplifier 31 and directly upstream of the first input contact 211.

Figure 4:
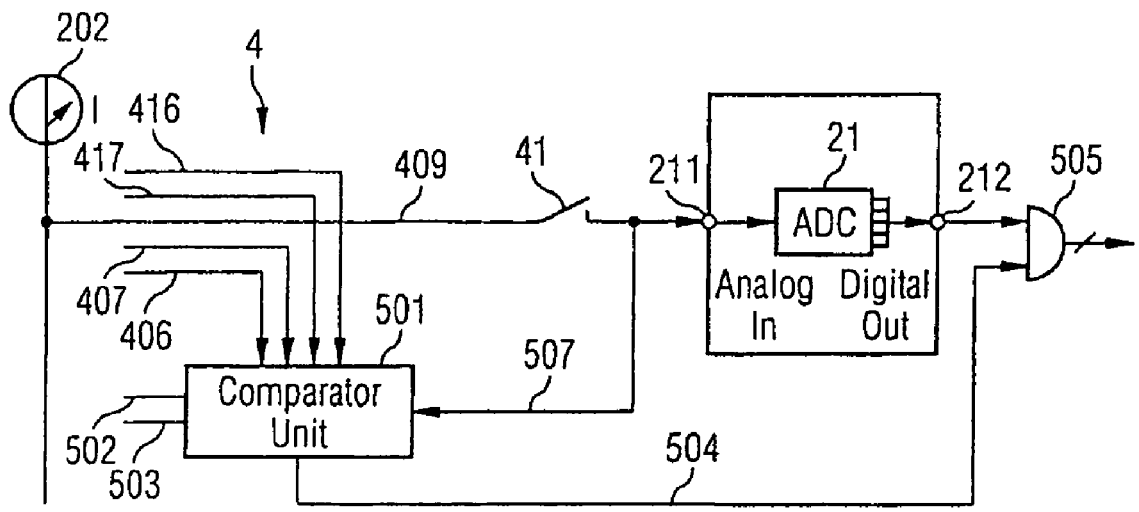
FIG. 4 illustrates a fifth short-circuit protective circuit according to another exemplary embodiment of the invention.

FIG. 4 illustrates a schematic illustration of a fifth short-circuit protective circuit 4 according to a second exemplary embodiment of the invention. FIG. 4 represents here an enlarged detail of the parallel test circuit diagram 2 shown in FIG. 2.

In the case of the fifth short-circuit protective circuit 4, the first short-circuit protective circuit 506 is embodied as a current-controlled isolating switch 41. For this purpose, the precision signal generator 201 is equipped with an ammeter 202.

The input impedance of the first input contact 211 is specified. It is therefore known how much current a functionally capable A/D converter 21-23 consumes. Before the calibration mode is carried out, the input contacts 211, 221, 231 of the parallel test circuit diagram 2 are successively tested for short-circuits. The test run is sequential here, each input contact 211, 221 and 231 is tested here successively for a short-circuit. At the start of the test, the current-controlled isolating switch 41 is in the opened state here. The precision signal generator 201 is set to a fixed voltage. The first current-controlled isolating switch 41 and the further short-circuit circuits 516 and 526 which are embodied as current-control isolating switches are then successively closed. The current which is output by the precision signal generator 201 and measured is compared with the anticipated current. If the measured current value deviates from its anticipated value after one of the current-controlled isolating switches 41 has closed, the respective A/D converter 21, 22, 23 is evaluated as being defective and the current-controlled isolating switch which is assigned to this A/D converter 21, 22, 23 remains opened during the following calibration mode and test mode, as a result of which the faulty A/D converter 21, 22, 23 is not taken into account in the following calibration and test mode.

In this embodiment of the invention, the control of the current-controlled isolating switches is performed by the ammeter 202. For this reason, an additional control line (not illustrated in FIG. 4) is required for each current-controlled isolating switch, the control line extending from the isolating switch to the ammeter 201 which is arranged at the precision signal generator 201.

Figure 5:
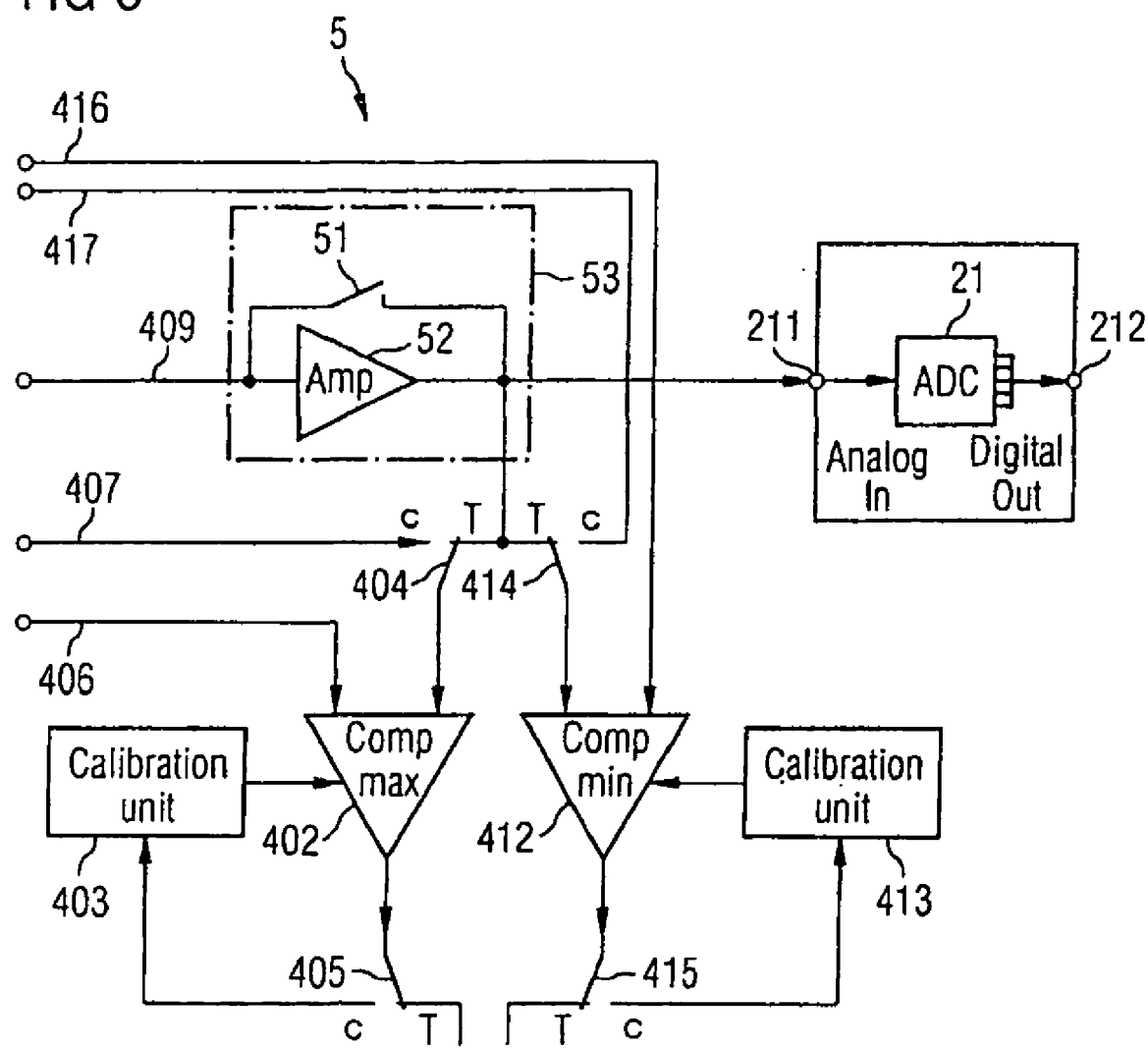
FIG. 5 illustrates a sixth short-circuit protective circuit with two comparators according to another exemplary embodiment of the invention.

FIG. 5 illustrates a schematic illustration of a sixth short-circuit protective circuit 5 according to a third exemplary embodiment of the invention. FIG. 5 represents here an enlarged detail of the parallel test circuit diagram 2 illustrated in FIG. 2.

In the sixth short-circuit protective circuit 5, the first comparator unit 501 is formed by a first comparator 402 with a first calibration unit 403, with a first switch 404 and with a second switch 405 as well as by a second comparator 412 with a second calibration unit 413, with a third switch 414 and with a fourth switch 415.

The first comparator 402 tests the signal value which is present at the first input contact 211 to determine whether it exceeds the maximum reference value which is generated by the first reference signal generator 401, and the second comparator 412 tests the signal value to determine whether it drops below the minimum reference value which is generated by the second reference signal generator 411.

The first calibration unit 403 is connected to the first comparator 402 and controls it. The first reference line 406 leads to the first input of the first comparator 402.

The first calibration line 407 leads to the second input of the comparator 402. A first switch 404 is provided directly before the second input of the first comparator 402 and it can connect the second input of the first comparator 402 either to the first calibration line 407 or to the test signal line 409. A second switch 405 is arranged at the output of the first comparator 402 and it can connect the output to the calibration unit 403.

The design and the mode of operation of the second comparator 412 with the switches 414 and 415 and with the calibration unit 413 corresponds to the described design and the described mode of operation of the first comparator 402 with the switches 404 and 405 as well as with the calibration unit 403.

The test signal line 409, the reference lines 406 and 416 as well as the calibration lines 407 and 417 are routed as closely as possible together so that all the lines experience the same external interference. The switch positions of the switches 404, 405, 414 and 415 are designated in FIG. 5 by the letters "T" for test mode and "C" for calibration mode.

A second isolation amplifier 52 is arranged on the test signal line 409. An isolating switch 51 is formed on a parallel signal line—which joins respectively directly upstream and downstream of the second isolation amplifier 52—of the test signal line 409. The isolating switch 51 and the second isolation amplifier 52 together form a comparator-controlled isolating circuit 53. The comparator-controlled isolating switch 51 can be switched by the comparators 402 and 412 by means of a control line (not shown in FIG. 5).

The line which can be connected via the switches 404 and 414 to the respective second input of the comparators 402 and 412 in the "T" switch position also joins that branching point of this parallel signal line which is located downstream of the second isolation amplifier 52.

The second isolation amplifier 52 is used to decouple the inputs, only low requirements being made of the frequency response, of the gain or of the linearity of the second isolation amplifier 52. The short-circuit test voltage which is output by the precision signal generator 201 merely has to be passed on by the second isolation amplifier 52, with essentially accurate amplitude, to the comparators 402 and 412.

At the start of the parallel test, the calibration mode is firstly carried out for all the A/D converters 21-23. The switches 404, 405, 414 and 415 are in the position "C" here. The position of the isolating switch 51 is insignificant for the calibration mode. The calibration mode is carried out in order to ensure that the comparators 402 and 412 switch precisely at the same voltages. The first reference line 406 and the first calibration line 407 are then connected to the inputs of the first comparator 402, and the second reference line 416 and the second calibration line 417 are connected to the inputs of the second comparator. The output of the first comparator 402 is connected to the first calibration unit 403, and the output of the second comparator 412 is connected to the second calibration unit 413.

In the calibration mode, the first calibration unit 403 adjusts the offset and the hysteresis of the first comparator 402 until the latter switches precisely when the voltages are the same. In an analogous fashion, the second calibration unit 413 adjusts the offset and the hysteresis of the second comparator 412 until the latter also switches precisely when the voltages are the same. This ensures that in the test mode the precision signal generator 201 is switched off precisely when the maximum reference voltage of the first reference signal generator 401 and the minimum reference voltage of the second reference signal generator 411 are reached.

The parallel short-circuit test is then carried out. In this context, the isolating switch 51 is firstly opened. During this short-circuit test, only the second isolation amplifier 52 is thus active. The switches 404, 405, 414 and 415 are then switched to the position "T".

A signal value which lies within the admissible interval which is defined by the precision signal generators 401 and 411 is then generated by the precision signal generator 201. If a short-circuit is then detected by one of the comparators 402 and 412, the comparator-controlled isolating switch 51 remains open even during the following test cycle and thus disconnects the short-circuit at first input contact 211 from the test signal line 409 and thus from the other input contacts 221 and 231. If a short-circuit is not detected by the comparators 402 and 412, the comparator-controlled isolating switch 51 is closed by the comparators 402 and 412 via the control line. As a result, a direct connection is established between the precision signal generator 201 and the first input contact 211.

The comparator-controlled isolating switch 51 is thus closed only at those A/D converters 21-23 which have passed the short-circuit test without faults. At those A/D converters 21-23 at which the short-circuit test has detected a fault, the comparator-controlled isolating switch 51 remains in the opened state.

The actual test mode is then carried out. Test signals are applied to the input contacts 211, 221, 231 by the reference signal generator 201 via the test signal line 409 until one of the comparators detects that the test signal leaves the interval defined by the reference signals of the precision signal generators 401 and 411. In this case the test mode is terminated.

In this exemplary embodiment it may be advantageous that the short-circuit test can be carried out in parallel for the A/D converters 21-23 which are to be tested in parallel, as a result of which a large saving in time is obtained. Furthermore, the second isolation amplifier 52 is very cost-effective, especially since only low requirements are made of the frequency response, the gain or the linearity of the second isolation amplifier 52. The short-circuit test voltage which is output by the precision signal generator 201 has to be passed on for only a short time by the second isolation amplifier 52 with an approximately accurate amplitude to the comparators 402 and 412. Furthermore, in this exemplary embodiment no external control lines are required to activate the switches 404, 405, 414, 415.

Figure 6:
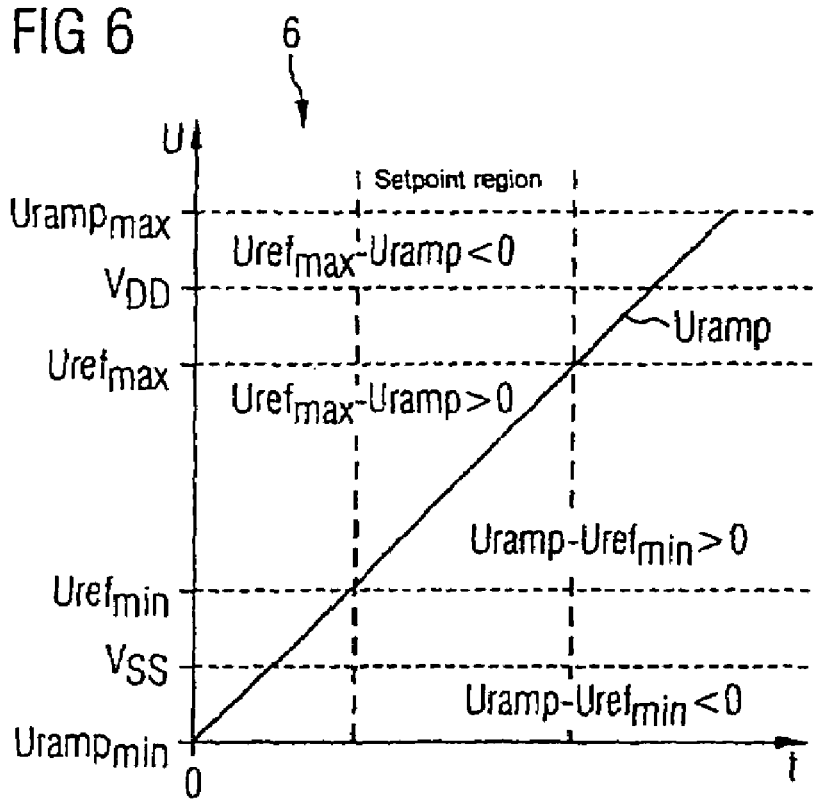
FIG. 6 illustrates a first illustration of the switching behavior of the comparators from FIG. 5.

FIG. 6 illustrates one embodiment of a first illustration 6 of the switching behavior of the comparators 402 and 412.

The horizontal axis of the illustration 6 of the switching behavior forms the time axis. The voltage value U which is present at the first input contact 211 is represented on the vertical axis.

A straight line which is designated by the designation "Uramp" is shown in the illustration 6 of the switching behavior and it represents a constantly rising test signal profile of the precision signal generator 201. The switching behavior of the first reference signal generator 401 is represented by the triangular region lying above this straight line, and the switching behavior of the second reference signal generator 411 is represented by the triangular region lying below this straight line.

The values $Uramp_{min}$ and $Uramp_{max}$ define the voltage value range which can be generated by the precision signal generator 201. The values $V_{SS}$ and $V_{DD}$ define the admissible range of the supply voltage for the first input contact 211. The maximum reference value which is generated by the first reference signal generator 401 is designated by $Uref_{max}$ in FIG. 6. The minimum reference value which is generated by the second reference signal generator 411 is shown by $Uref_{min}$ in FIG. 6.

The range which is defined by the straight lines $Uref_{min}$ and $Uref_{max}$ indicates the setpoint region in which the signal voltage Uramp is lower than the maximum reference voltage and higher than the minimum reference voltage. In this range, both comparators 404 and 414 output a logic one.

For the short-circuit test, the precision signal generator 201 is set to any desired voltage in this range, for example to the mean value of the minimum and maximum reference signal values.

With respect to the possible short-circuits, a distinction is made between a short-circuit to ground, that is to say to $V_{SS}$ and a short-circuit to the operating voltage, that is to say to $V_{DD}$. If the input contact 211 of the first A/D converter 21 is short-circuited to $V_{SS}$, the signal value lies below the minimum reference value $Uref_{min}$, with the result that the second comparator 412 outputs a logic zero. If the first input contact is short-circuited to $V_{DD}$, the test voltage value lies above the maximum reference value $Uref_{max}$, and in this case the first comparator 402 outputs a logic zero. In contrast, if a short-circuit does not occur, both comparator outputs have the same logic output value one, as already described above.

Figure 7:
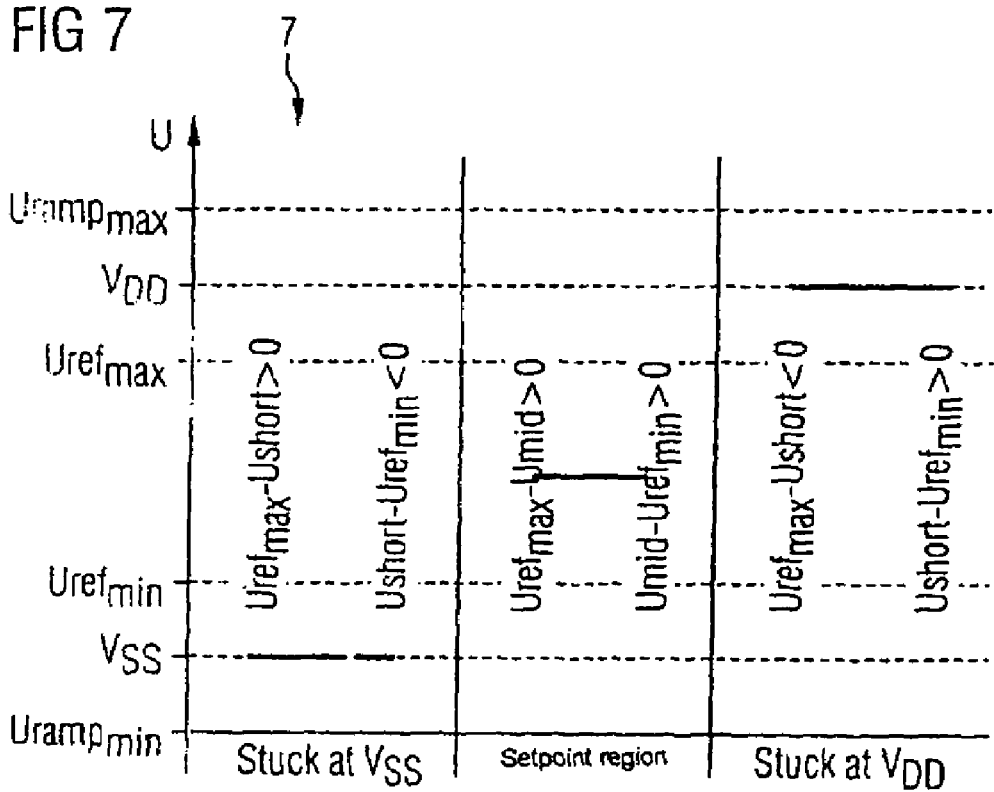
FIG. 7 illustrates a second illustration of the switching behavior of the comparators from FIG. 5.

FIG. 7 illustrates another embodiment of a second illustration 7 of the switching behavior of the comparators 402 and 412.

In the second illustration 7 of the switching behavior, the short-circuit voltage is designated by $U_{short}$, an the test voltage which respectively lies in the admissible range at the first input contact 211 is designated by $U_{mid}$.

The second illustration 7 of the switching behavior is divided into three regions lying one next to the other.

In the left-hand region, a short-circuit to ground (stuck at $V_{SS}$) is illustrated, in the central region an admissible test signal value during the short-circuit test is shown, and a short-circuit to the supply voltage $V_{DD}$ (stuck at $V_{DD}$) is shown in the right-hand region.

The mathematical term which is given on the left in each of these three regions describes the examination which is carried out in the first comparator 402, and the respective second term describes the examination which is respectively carried out in the second comparator 412.

In the left-hand region of the second illustration 7 of the switching behavior, the second comparator 412 outputs a logic zero since the difference between $U_{short}$ and $Uref_{min}$ yields a value which is less than zero.

In the central region, both comparators 402 and 412 output logic ones.

In the third region, the first comparator 402 outputs a logic zero since the difference between $Uref_{max}$ and $U_{short}$ is less than zero.

The present invention makes available a device and a method in which parallel testing of integrated circuits can be carried out and with which faulty integrated circuits can be reliably distinguished from faultfree integrated circuits.

The invention relates to an electrical short-circuit protective circuit for protecting an input contact against short-circuits. Its input is intended for connection to a signal generator, and its output is intended for connection to an input contact or to a signal input. The electrical short-circuit protective circuit is therefore located on the signal path of the test circuit. The input contact is intended to receive test signals which are generated by the signal generator, in particular currents and voltages, and to apply these test signals to an integrated circuit. The electrical short-circuit protective circuit is capable of electrically decoupling the input contact from the region which lies upstream of the input of the electrical short-circuit protective circuit. Embodiments of the invention are illustrated in FIGS. 1-7, previously discussed herein.

The provision of a short-circuit protective circuit for each input contact ensures that short-circuits which are generated by faulty integrated circuits which are to be tested cannot affect other input contacts. This ensures that only the integrated circuits which are actually faulty are detected as faulty and eliminated, whereas the other faultfree integrated circuits are tested further and, if they pass the further tests, leave the test process in the usual way. As a result, the yield when testing is increased and at the same time it is ensured that n integrated circuits can be tested simultaneously. This reduces the overall test time, while the equipment for the tester which is used remains the same. All that is necessary is to adapt the load board to hold a plurality of integrated circuits and to provide such an additional short-circuit protective circuit which can be implemented cost-effectively.

Such an electrical short-circuit protective circuit can be arranged directly at the input contact, it being advantageous here that the signal values which are considered by the short-circuit protective circuit correspond very precisely to the signal values which are actually present at the input contact.

The simplest implementation of such decoupling according to the invention can be achieved by means of an isolation amplifier which must satisfy relatively stringent requirements in terms of the frequency response and the linearity. In this embodiment of the invention, it is not necessary to take any further measures to decouple the signal inputs. A plurality of signal inputs or a plurality of integrated circuits which are connected to these signal inputs can be tested simultaneously, as a result of which considerable savings in terms of cost and time are obtained.

According to a further embodiment of the invention, an input contact is decoupled only if the test signal present at the input contact assumes an inadmissible value, in particular has a short-circuit.

For this purpose, the electrical short-circuit protective circuit can be embodied as a current-controlled isolating switch. In this embodiment of the invention, an ammeter is additionally provided and is arranged in particular at a signal generator. The connection between the signal generator and the input contact is disconnected if a current value which is sensed by the ammeter and is present at the input contact differs from an anticipated current value. In this context, a control line is also provided between the current-controlled isolating switch and the ammeter and can be used to switch the current-controlled isolating switch. By means of this embodiment of the invention, defective components which are to be tested can be detected precisely and disconnected individually. The test run is carried out here in a sequential fashion for all the components which are connected in parallel.

In one alternative embodiment, the electrical short-circuit protective circuit has an isolating switch and an isolation amplifier connected in parallel with the isolating switch. The inputs of the isolating switch and of the isolation amplifier are connected to a signal generator, and the outputs of the isolating switch and of the isolation amplifier are connected to an input contact. This embodiment of the invention constitutes a decoupling means for parallel input contacts which operates precisely and can be implemented cost-effectively and in which the input contacts can be tested simultaneously and if appropriate disconnected. There is no need for any additional external control lines. The isolation amplifier is active only during the short-circuit test which is carried out at the beginning, and is used only for decoupling the inputs. Only low requirements are made of the frequency response, the gain and the linearity of the isolation amplifier. All that is necessary is for the short-circuit test voltage which is output by the signal generator to be passed on with an approximately accurate amplitude to the isolation amplifier.

In one of the embodiments described above, the electrical short-circuit protective circuit can be integrated monolithically on the integrated circuit which is to be tested.

The invention also relates to a test apparatus for testing integrated circuits, in particular of dynamic A/D converters. This test apparatus comprises at least one input contact for connection to an integrated circuit, in each case one electrical short-circuit protective circuit (described above) for each input contact, the output of which short-circuit protective contact is connected to the associated input contact, and a signal generator for generating a test signal which is connected to each input of the electrical short-circuit protective circuit or circuits via one connecting line in each case. With such a test apparatus it is possible to test a plurality of integrated circuits simultaneously and with protection against short-circuits.

In a first embodiment, the test apparatus also comprises in each case a comparator unit for each input contact and at least one reference signal generator. This comparator unit is connected to the input or to the output of the electrical short-circuit protective circuit. The method of implementing the short-circuit protective circuit determines in each case whether the comparator unit is connected here to the input or to the output. The reference signal generator for generating a reference signal is connected to each comparator unit by means of at least one line, in particular by means of a reference line and by means of a calibration line. It is particularly advantageous here that the test signals can be checked by the comparator units against the reference signals and the comparator units can be calibrated precisely. This produces particularly reliable test results.

Each comparator unit can be operated in a test mode in which the test signal of the respective input contact is compared to the reference signal and in which the signal generator is switched off by the comparator unit if the test signal exceeds or drops below the reference signal. This ensures that the test signals lie within a desired interval which can be set precisely.

Furthermore, if a decision logic unit is provided which is connected to the comparator units and which can generate control signals for the precision signal generator from the output signals of the comparator units, the comparator units or the comparators can be calibrated in parallel before the start of a test cycle. As a result, the test can be speeded up further.

According to a further embodiment of the invention, the test apparatus comprises two reference signal generators. The first reference signal generator generates a lower reference signal here and the second reference signal generator generates an upper reference signal. In this embodiment, each input contact has two comparator units, specifically a first comparator unit, which is connected to the first reference signal generator, and a second comparator unit, which is connected to the second reference signal generator.

This ensures that the integrated circuits are tested only with test signals which are arranged within the test interval which is defined by the lower reference signal and the upper reference signal. The test signal values which are actually present at the input contacts of the integrated circuits can thus be reliably controlled.

In one embodiment of the test apparatus according to the invention which is easy to manufacture, each comparator unit comprises one comparator in each case. It is particularly simple and cost-effective if the test apparatus comprises in each case one comparator with two inputs and with one output. The first input of each comparator is connected to the reference line of the respective reference signal generator, and the second input of each comparator can be connected to the calibration line of the respective reference signal generator and to the input or the output of the electrical short-circuit protective circuit. The output of each comparator can be connected to its calibration unit and to the precision signal generator. The switching properties, in particular the offset and the hysteresis of the comparator, can be set here by means of the calibration unit.

According to a further embodiment of the invention, in each case two lines, specifically a calibration line and a reference line, extend to the comparator unit or units from the reference signal generator or from the reference signal generators. Furthermore, each comparator unit also comprises a calibration unit to whose control input the output of the comparator unit is respectively connected. The calibration line and the reference line are routed as closely as possible together with the signal line so that all these lines are subject to the same external interference. The comparator unit can also be operated in a calibration mode in which the switching properties of the comparator unit, in particular the offset/deviation from the zero value and the hysteresis/residual effect of the test signal after the switching off are set by comparing the signal values present on the calibration line and on the reference line of the calibration unit with one another.

Owing to external interference or as a result of the influence of the different signal paths it is possible for the test mode to start and end at the different integrated circuits at slightly staggered times. In order to prevent this, the respectively valid time window is communicated to the evaluation logic of the tester. For this purpose, the invention provides in each case one checking signal line which leads from each comparator unit to the respective output line which joins the output contact of the integrated circuit to be tested. A check signal is conducted via this check signal line to the respective output line, in particular to an AND gate which is arranged downstream of the output contact and is linked there to the digital output of each integrated circuit.

If the electrical short-circuit protective circuit is embodied as a current-controlled isolating switch, the electrical short-circuit protective circuit can be operated in a short-circuit test mode. In this short-circuit test mode, the current-controlled isolating switch is switched in such a way that the connection between the signal generator and the input contact is closed, and that the ammeter can detect whether the current value which is generated by the signal generator and is present at the input contact lies in a defined admissible value range. The current-controlled isolating switch is opened by the ammeter if the current value which is generated by the signal generator and is present at the input contact does not lie in the defined admissible value range. Otherwise, it remains closed for the rest of the test run. With this short-circuit test mode it is possible to detect faulty integrated circuits precisely and disconnect them selectively.

Such an advantageous short-circuit test mode can also be carried out with an electrical short-circuit protective circuit which is embodied as the isolating switch and the isolation amplifier which are connected in parallel. In this context, in each case one control line is provided between in each case one isolating switch and the associated comparator unit, and the respective input contact can be switched in such a way that it is connected to the comparator unit. In the short-circuit test mode, the short-circuit protective circuit is first switched in such a way that the connection between the signal generator and the input contact runs only via the isolation amplifier and the isolating switch is disconnected. Furthermore, the input contact is switched in such a way that the test signal which is present at the input contact is connected to the comparator unit.

If a short-circuit is not present or if the test signal which is present at the input contact assumes an admissible value, the isolating switch is switched by the comparator unit in such a way that the connection between the signal generator and the input contact runs via the isolating switch.

However, if a short-circuit is present or if the test signal which is present at the input contact assumes an inadmissible value, the isolating switch is switched by the comparator unit in such a way that the isolating switch is disconnected and the connection between the signal generator and the input contact runs only via the isolation amplifier.

In order to ensure a high level of functionality of the test apparatus, the comparator units and the short-circuit protective circuits can be switched to and fro between the short-circuit test mode, the calibration mode and the test mode.

The test apparatus according to the invention which is described above can be implemented in various ways. The different embodiments of the test apparatus according to the invention differ here only in the partitioning or in the arrangement of the individual elements of the test apparatus according to the invention. Depending on the availability of circuitry area on the integrated circuits, individual elements, or even all the elements, of the described test apparatus can be accommodated in the integrated circuits as BIST/Built-In Self Test circuitry. Different cost savings can be achieved depending on how many elements of the test apparatus according to the invention can be accommodated on the integrated circuit.

The invention also relates to an integrated circuit with an electrical short-circuit protective circuit described above or with a test apparatus described above. Here, the short-circuit protective circuit or the test apparatus is monolithically integrated on this integrated circuit and formed in addition to the actual circuit of the integrated circuit. It is possible here for the common precision signal generator to be replaced by local digital signal sources which are formed in the integrated circuits. This on-chip solution is particularly cost-effective.

In this embodiment it is possible either to position only the short-circuit protective circuit or else the entire arrangement of the described test apparatus with the precision signal generator, with the short-circuit protective circuit, with the comparator unit or with the comparator and with the calibration unit as well as with the reference signal generators on the integrated circuit. However, a precondition for this is that the additional chip area which is necessary for this is available. In particular in the case of integrated circuits in which the circuitry area is limited only by the number of connecting contacts to be applied there is generally sufficient chip area available. In this embodiment of the invention, a filter, in particular a low-pass filter, which is capable of converting a generated test signal into a desired analog signal is additionally required on the load board for each integrated circuit. The reference voltage sources may be implemented, for example, by means of highly stable and temperature-compensated band gaps. This embodiment of the test apparatus according to the invention is particularly optimum in terms of costs, especially since it no longer requires any special test properties and can be used in a particularly versatile way.

The short-circuit protective circuit and test apparatus according to the invention which are described above can also be formed on a load board for holding at least one needle card for testing integrated circuit and/or having at least one test base for testing integrated circuit and/or for connecting a handler to a tester of integrated circuits. In the process, all the elements of the short-circuit protective circuit or test apparatus which are described above can be positioned on the load board.

Alternatively, when the test apparatus is formed on the load board it is also possible to replace the central precision signal generator of the tester by digital signal sources which are accommodated locally in the integrated circuits. The comparator units or comparators are positioned on the load board in this arrangement and can control the internal precision signal generators. This requires the integrated circuit to have an external control interface such as, for example, an I$^2$C bus. This is the case in many mixed signal modules. They are therefore particularly suitable for this solution.

The invention also relates to a tester for testing integrated circuits which has a plurality of instruments for generating signals or data streams and a plurality of measuring sensors, in particular for currents and voltages. The tester also comprises a load board which is described above and a short-circuit protective circuit or tester device which is also described above. In this context, the precision signal generator and the reference signal generator or generators is/are arranged on the tester, and the comparator units or comparators with the calibration units are arranged on the load board, in each case adjacent to the input contacts for the integrated circuits. A tester with a test apparatus which is arranged in such a way can test virtually any desired number of integrated circuits in parallel, the test apparatus according to the invention ensuring that the test results which are obtained here are reliable and only the integrated circuits which are actually faulty are eliminated.

The invention also relates to a method for the parallel testing of integrated circuits.

Here, a tester which is described above is firstly provided on a load board. The load board is then equipped with a plurality of integrated circuits. The integrated circuits are connected here to the input contacts. In this context, a signal generator as well as in each case one electrical short-circuit protective circuit are provided for each integrated circuit to be tested. A test mode in which test signals are applied to the input contacts by the signal generator is then executed.

If the electrical short-circuit protective circuit which is provided is embodied as an isolation amplifier, the input contacts are decoupled during the normal test run. It is therefore not necessary to carry out a separate short-circuit test. The test run can be carried out simultaneously for all the integrated circuits which are tested in parallel.

If the electrical short-circuit protective circuit which is provided is embodied as a current-controlled isolating switch or as an isolating switch with isolation amplifier, the short-circuit test is carried out before the actual test run.

In this context it is first determined whether the test signal which is present at the respective input contact has an inadmissible value, in particular a short-circuit. Then, those input contacts at which an inadmissible value, in particular a short-circuit has been detected, are selectively decoupled.

In the embodiment as a current-controlled isolating switch, the test signal is then tested by means of the ammeter, and in the embodiment as an isolating switch with an isolation amplifier it is tested by means of the comparator unit.

An inadmissible value of the test signal is not detected here until the respective signal input is decoupled. In the embodiment as a current-controlled isolating switch, this decoupling is carried out by opening the respective isolating switch under the control of the ammeter, and in the embodiment as an isolating switch with isolation amplifier it is carried out by opening the isolating switch under the control of the comparator unit.

A calibration mode can also be carried out before the test run or before the short-circuit test.

The method according to the invention can be carried out with a test apparatus which is described above and with an integrated circuit which is described above and has such a test apparatus, with a load board which is described above and has such a test apparatus and with a tester which is described above and has such a device. The possibilities of use of the method according to the invention are correspondingly extremely varied.

The invention is also implemented in a computer program or software for carrying out the method for the parallel testing of integrated circuits. The computer program here contains program instructions which cause a computer system to carry out such test methods in an embodiment which is described above. Here, in particular the method of the short-circuit protective test mode, of the test mode and of the calibration mode are controlled with a computer system or carried out on a computer system itself. The computer program outputs the results of the tested integrated circuits on an output unit, in particular on a screen or on a printer, as digital data sequences or in a form of representation which can be generated therefrom, or stores these result data in a memory area. The computer program according to the invention enables integrated circuits to be tested quickly, effectively and reliably and eliminated if appropriate, the parallel treatment of a plurality of circuits resulting in a significant speeding up of the test run time.

The invention also relates to a computer program which is contained on a storage medium, and in one embodiment on a computer memory or in a direct access memory or which is transmitted on an electrical carrier signal. The invention also relates to a carrier medium, in particular a data carrier such as, for example, a diskette, a zip drive, a streamer, a CD or a DVD on which a computer program which is described above is stored. In addition, the invention relates to a computer system on which such a computer program is stored. Finally, the invention also relates to a download method in which such a computer program is downloaded from an electronic data network such as from the Internet, for example, to a computer which is connected to the data network.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A test apparatus for testing electrical circuits, including integrated circuits, in particular of dynamic A/D converters, the test apparatus comprising:

at least one input contact configured for connection to an integrated circuit;

an electrical short-circuit protective circuit provided for each input contact, the electrical short-circuit protective circuit comprising:

an input configured for connection to a signal generator;

an output configured for connection to the input contact configured for connection to the integrated circuit; where the input contact configured for connection to the integrated circuit can be decoupled from the region lying upstream of the input of the electrical short-circuit protective circuit by the electrical short-circuit protective circuit;

the output of, in each case, one electrical short-circuit protective circuit is connected to the associated input contact configured for connection to the integrated circuit;

a signal generator, which is configured to generate a test signal and which is connected to each input of the electrical short-circuit protective circuit or circuits via one connecting line in each case.

2. The test apparatus as claimed in claim 1, wherein a comparator unit is provided for each input contact, which comparator unit is connected to the input or to the output of the electrical short-circuit protective circuit, the test apparatus comprising at least one reference signal generator which is configured to generate a reference signal and which is connected to each comparator device by means of at least one line, in particular by means of a reference line and by means of a calibration line.

3. The test apparatus as claimed in claim 2, wherein each comparator unit can be operated in a test mode such that the test signal of the respective input contact can be compared to the reference signal, and wherein the signal generator can be switched off by the comparator unit if the test signal exceeds or drops below the reference signal.

4. The test apparatus as claimed in claim 2, wherein a decision logic unit is provided which is connected to the comparator units and which is configured such that control signals for the signal generator can be generated from the output signals of the comparator units.

5. The test apparatus as claimed in claim 2, wherein two reference signal generators are provided, the first reference signal generator configured to generate a lower reference signal, and the second reference signal generator configured to generate an upper reference signal, each comparator unit being capable of testing the test signals to determine whether they drop below the lower reference signal which is generated by the first reference signal generator, and to determine whether they exceed the upper reference signal which is generated by the second reference signal generator.

6. The test apparatus as claimed in claim 2, wherein the comparator unit or units has/have one comparator in each case.

7. The test apparatus as claimed in claim 2, wherein each comparator unit has a calibration unit, the comparator unit being operable in a calibration mode which is configured such that the switching properties of the comparator unit can be set by the calibration unit by means of the signal values of the calibration line and of the reference line which are present at the comparator unit.

8. The test apparatus as claimed in claim 7, wherein each comparator has two inputs and one output, the first input of each comparator being connected to the reference line of the respective reference signal generator, the second input of each comparator being capable of being connected to the calibration line of the respective reference signal generator and to the input or to the output of the electrical short-circuit protective circuit, the output of each comparator being capable of being connected to its calibration unit and to the signal generator, and the switching properties of the calibration unit being capable of being set by means of the comparator.

9. The test apparatus as claimed in claim 2, wherein in each case one checking signal line leads to the respective output line from each comparator unit.

10. The test apparatus as claimed in claim 1, wherein in each case an output contact is provided for each of the input contacts configured for connection to the integrated circuit, and wherein the output contacts are connected to an output line and are configured for connection to an output of the integrated circuit.

11. The test apparatus as claimed in claim 1, the electrical short-circuit protective circuit or circuits are operable in a short-circuit test mode in which the current-controlled isolating switch is switched in such a way that the connection between the signal generator and the input contact is closed, and wherein it is possible for the ammeter to detect whether the current value generated by the signal generator and present at the input contact lies in a defined admissible value range, and in which the current-controlled isolating switch is configured to be opened by the ammeter if the current value that is generated by the signal generator and is present at the input contact does not lie in the defined admissible value range.

12. The test apparatus as claimed in claim 1, comprising:
a control line being provided between, in each case, an isolating switch and the associated comparator unit, the input contact being capable of being switched in such a way that it is connected to the comparator unit, the test apparatus being capable of being operated in a short-circuit test mode comprising:
the short-circuit protective circuit is switched in such a way that the connection between the signal generator and the input contact runs only via the isolation amplifier;
the input contact is switched in such a way that the test signal which is present at the input contact is connected to the comparator unit; the isolating switch can either be switched by the comparator unit in such a way that the connection between the signal generator and the input contact runs via the isolating switch if the test signal which is present at the input contact assumes an admissible value, and/or can be switched in such a way that the connection between the signal generator and the input contact runs only via the isolation amplifier if the test signal which is present at the input contact assumes an inadmissible value.

13. The test apparatus as claimed in claim 1, wherein the comparator unit or units and the short-circuit protective circuit or circuits can be switched to and fro between the short-circuit test mode, the calibration mode and the test mode.

14. The test apparatus as claimed in claim 1, wherein the test apparatus is monolithically integrated on an integrated circuit.

15. The test apparatus as claimed in claim 1, further comprising a second input contact configured for connection to the integrated circuit.

* * * * *